(12) United States Patent
Yu

(10) Patent No.: US 11,365,875 B1
(45) Date of Patent: Jun. 21, 2022

(54) INTEGRATED CONTROL DEVICE

(71) Applicant: Ledup Manufacturing Group Limited, Irwindale, CA (US)

(72) Inventor: Jing Jing Yu, Irwindale, CA (US)

(73) Assignee: Ledup Manufacturing Group Limited, Irwindale, CA (US)

( * ) Notice: Subject to any disclaimer, the term of this patent is extended or adjusted under 35 U.S.C. 154(b) by 0 days.

(21) Appl. No.: 17/125,653

(22) Filed: Dec. 17, 2020

(51) Int. Cl.
*F21V 23/00* (2015.01)
*H05K 5/02* (2006.01)
*H05B 47/185* (2020.01)
*H05B 47/19* (2020.01)
*F21W 121/04* (2006.01)

(52) U.S. Cl.
CPC ......... *F21V 23/008* (2013.01); *H05B 47/185* (2020.01); *H05B 47/19* (2020.01); *H05K 5/0217* (2013.01); *F21W 2121/04* (2013.01)

(58) Field of Classification Search
CPC ..... F21V 23/008; H05B 47/185; H05B 47/19; H05K 5/0217; F21W 2121/04
See application file for complete search history.

(56) References Cited

U.S. PATENT DOCUMENTS

| | | | | |
|---|---|---|---|---|
| 6,794,825 B1 * | 9/2004 | Kao | ........................ | A47G 33/06 315/185 R |
| 8,314,564 B2 | 11/2012 | Yu et al. | | |
| 8,723,432 B2 | 5/2014 | Yu et al. | | |
| 8,836,224 B2 | 9/2014 | Chen et al. | | |
| 9,226,351 B2 | 12/2015 | Chen et al. | | |
| 9,955,538 B2 | 4/2018 | Yu et al. | | |
| 10,542,602 B2 | 1/2020 | Yu | | |
| 10,683,974 B1 * | 6/2020 | Chen | ........................ | F21V 23/06 |
| 2006/0039146 A1 * | 2/2006 | Wu | ........................ | F21V 23/04 362/235 |
| 2010/0108863 A1 * | 5/2010 | Yang | ........................ | H05B 47/11 250/214 AL |
| 2011/0051471 A1 * | 3/2011 | Chen | ........................ | H02M 7/003 363/21.16 |
| 2013/0249394 A1 * | 9/2013 | Fay | ........................ | B60Q 1/30 315/77 |
| 2014/0077726 A1 * | 3/2014 | McRae | ........................ | H05B 45/22 315/313 |
| 2015/0035437 A1 * | 2/2015 | Panopoulos | ............ | B60L 53/12 315/112 |
| 2015/0084515 A1 * | 3/2015 | Altamura | ............ | H05B 47/115 315/131 |
| 2015/0091438 A1 * | 4/2015 | Hessling Von Heimendahl ......... | | B64D 11/00 315/77 |
| 2016/0268728 A1 * | 9/2016 | Zantout | ..................... | G06F 1/20 |
| 2018/0206300 A1 * | 7/2018 | Farnsworth | ............ | H05B 47/19 |
| 2018/0359830 A1 * | 12/2018 | Wang | ................... | H05B 39/044 |

FOREIGN PATENT DOCUMENTS

CN      212210834 U     12/2020

* cited by examiner

*Primary Examiner* — Renan Luque
(74) *Attorney, Agent, or Firm* — William W. Cochran; Cochran Freund & Young, LLC

(57) ABSTRACT

Disclosed is an integrated compact power supply system that includes a converter for converting AC power to a DC voltage capable of operating individual decorations or displays or portions of decorations or displays. Decorations or displays can be hardwired to the integrated system or wirelessly connected. Both lighting strings or individual LEDs can be controlled separately. Portions of lighting displays can also be controlled.

14 Claims, 7 Drawing Sheets

INTEGRATED CONTROL DEVICE

BACKGROUND

Pre-lit Christmas trees, as well as various lighting displays, have used LEDs because of the various advantages provided by LEDs. For example, LEDs have a long lifetime, are reliable, consume a low amount of energy and do not produce significant heat. Pre-lit Christmas trees typically use LEDs. These LEDs can produce different colors and provide various visual effects. Further, LEDs have been used in various lighting displays for commercial advertising because of the advantages provided by LEDs, including the various colors and visual effects that can be produced by LEDs through the use of controllers. For these reasons, LEDs have become important products for both pre-lit Christmas trees and lighting displays, as well as other uses in various products.

SUMMARY

An embodiment of the present invention may therefore comprise a method of controlling visual effects of multiple lighting displays from a single integrated, waterproof unit that can be used in outside environments comprising: securing plug blades in a molded, waterproof package, the plug blades fitting in a standard alternating current wall socket; encapsulating an AC to DC converter and a controller in the molded, waterproof package; forming a connecter block as part of the molded, waterproof package having separate outputs for each of the multiple lighting displays; receiving control commands that are communicated to the controller; generating control signals from the controller in response to the control commands; transmitting the control signals to the connector block; connecting the control signals to separate outputs in the connector block for connection to the multiple lighting displays to control the visual effects of the multiple lighting displays.

Another embodiment of the present invention may therefore comprise a method of controlling visual effects of multiple portions of a lighting display from a single, integrated waterproof unit that can be used in outside environments comprising: forming the single, integrated waterproof unit using plastic molding to form a molded, single integrated waterproof package; securing plug blades in the molded, single integrated waterproof package, the plug blades fitting in a standard alternating current wall socket; encapsulating an AC to DC converter and a controller in the molded, single integrated waterproof package; encapsulating a transmitter in the molded, single integrated waterproof package; receiving control commands that are communicated to the controller; generating control signals from the controller in response to the control commands; sending the control signals from the controller to the transmitter; transmitting the control signals through an antenna connected to the transmitter to the multiple portions of the lighting display.

Another embodiment of the present invention may therefore comprise a system for controlling visual effects of multiple lighting displays comprising: a remote transmitter that generates command signals to control the visual effects; a plastic, molded, integrated waterproof package that receives the command signals; plug blades secured in the plastic, molded, integrated waterproof package that fit in a standard alternating current wall socket; an AC to DC converter encapsulated in the plastic, molded, integrated waterproof package that produces a direct current signal; a receiver that receives the command signals from the remote transmitter; a controller that receives the command signals and generates control signals to individually control the multiple lighting displays in response to the command signals; a transmitter that transmits the control signals to the multiple lighting displays to individually control the multiple lighting displays.

Another embodiment of the present invention may therefore comprise a method of controlling visual effects of multiple portions of a lighting display using a plastic molded, single integrated waterproof package that can be used in outdoor environments comprising: forming the plastic molded, single integrated waterproof package using plastic molding processes; securing plug blades in the plastic molded, single integrated waterproof package, the plug blades having a size and spaced apart to fit into a standard alternating current wall socket; encapsulating an AC to DC converter, a controller and a transmitter in the plastic molded, single integrated waterproof package; securing at least one antenna to the plastic molded, single integrated waterproof package; receiving wireless control commands, from a remote transmitter, for controlling portions of the lighting display; communicating the control commands to the controller; generating control signals, from the controller, for controlling the portions of the lighting display in response to the control commands; sending the control signals from the controller to an integrated transmitter; transmitting the control signals from the antenna to the lighting display to individually control portions of the lighting display.

Another embodiment of the present invention may therefore comprise a system for controlling visual effects of portions of a lighting display comprising: a plastic, molded, integrated waterproof package that receives command signals; plug blades secured in the plastic, molded, integrated waterproof package that fit in a standard alternating current wall socket; an AC to DC converter encapsulated in the plastic, molded, integrated waterproof package that generates a direct current signal; a controller encapsulated in the plastic, molded, integrated waterproof package that receives command signals and generates control signals to individually control the portions of the lighting display; a connector block that transmits the control signals to the portions of the lighting display to control the lighting display.

Another embodiment of the present invention may therefore comprise a system for a transmitter that transmits comprising: a plastic, molded, integrated waterproof package that receives command signals; plug blades secured in the plastic, molded, integrated waterproof package that fit in a standard alternating current wall socket; an AC to DC converter encapsulated in the plastic, molded, integrated waterproof package that generates a direct current signal; a controller encapsulated in the plastic, molded, integrated waterproof package that receives command signals and generates control signals to individually control the portions of the lighting display; an integrated transmitter that transmits the control signals to the portions of the lighting display to control the lighting display.

DETAILED DESCRIPTION OF THE EMBODIMENTS

Figure 1:
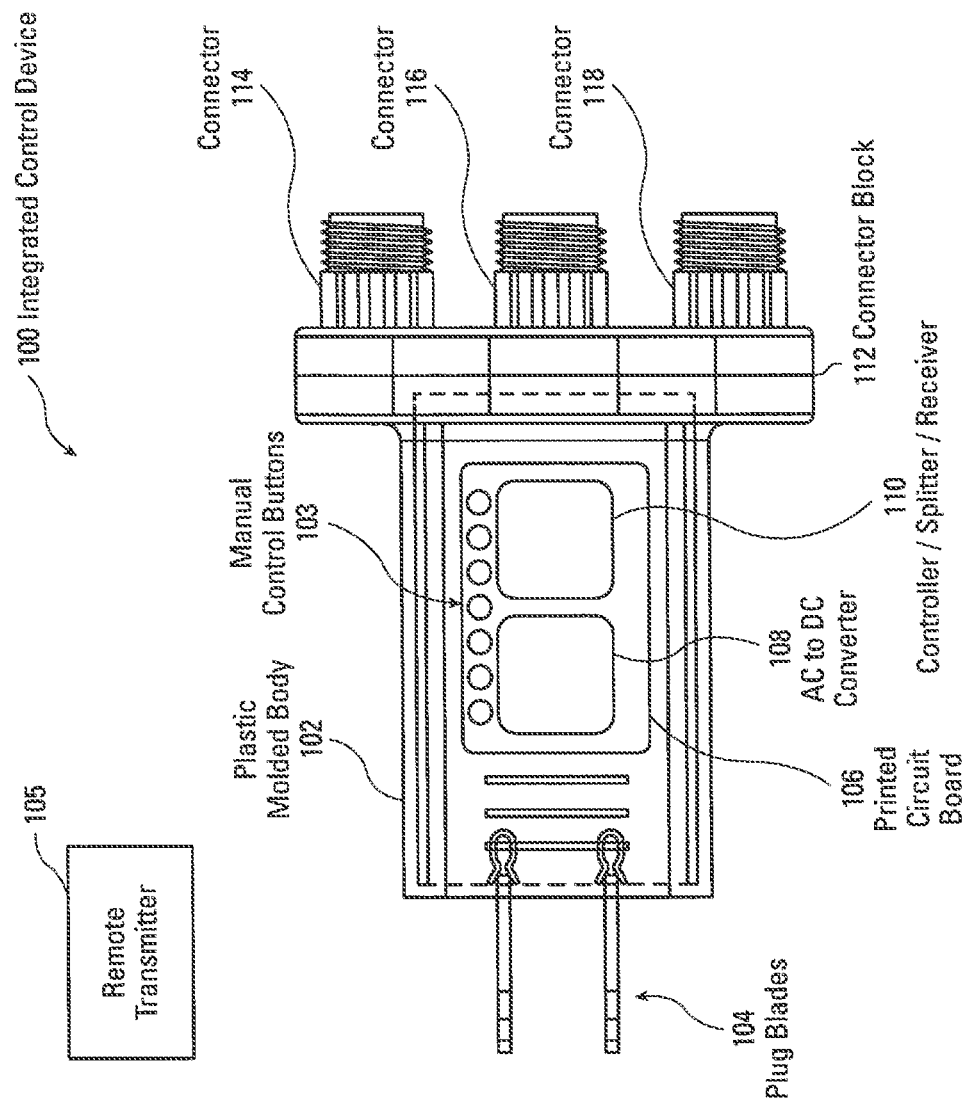
FIG. 1 is a schematic illustration of an embodiment of the integrated control device.

FIG. 1 is a schematic diagram of an integrated control device 100. As illustrated in FIG. 1, the integrated control device 100 is encapsulated in single integrated package having a plastic molded body 102. In other words, the integrated control device 100 is a single package that can supply multiple outputs for light displays such as pre-lit Christmas trees and other lighting applications such as commercial advertising lighting displays or decorative lighting displays. Previously, separate components were necessary to provide the functions that are available from the integrated control device 100.

As shown in FIG. 1, plug blades 104 are molded into the plastic molded body 102. Plug blades 104 are made to plug into an electrical wall receptacle so that an electrical wall receptacle can be used to supply power to the integrated control device 100. The connector block 112 is shown as having three connectors 114, 116 and 118. Of course, any number of connectors can be provided. The connectors 114, 116, 118 connect to wires that are connected to lighting displays such as pre-lit Christmas trees or other lighting applications. The connector block 112 and connectors 114, 116, 118 may comprise a portion of the plastic molded body 102 to create the single integrated package. Since the integrated control device 100 is a single molded package, it is waterproof and the electronics comprising the printed circuit board 106, AC to DC converter 108 and controller/splitter/receiver 110 are located in the plastic molded body 102, which is waterproof and protects these components from the weather. The single plastic molded body provides greater reliability and allows for usage in outdoor applications.

The printed circuit board 106 is designed to mount and connect the AC to DC converter 108 to the plug blades 104, which provide the AC power to the AC to DC converter 108. AC to DC converter 108 converts the AC power to DC power having the correct voltage for illuminating the LEDs connected to the connectors 114, 116, 118. Light strings for lighting displays, such as Christmas lights, commercial lighting displays or other lighting applications may be connected to connectors 114, 116, 118. The controller/splitter/receiver 110 receives command signals from manual control buttons 103 or remote transmitter 105. The controller portion of controller/splitter/receiver 110 generates control signals in response to the control commands from manual control buttons 103 or remote transmitter 105. The control signals are split and applied to the proper connector 114, 116, 118. The receiver portion of controller/splitter/receiver 110 receives wireless command signals from remote transmitter 105. This is explained in more detail below with respect to FIGS. 4 and 5.

Figure 2A:
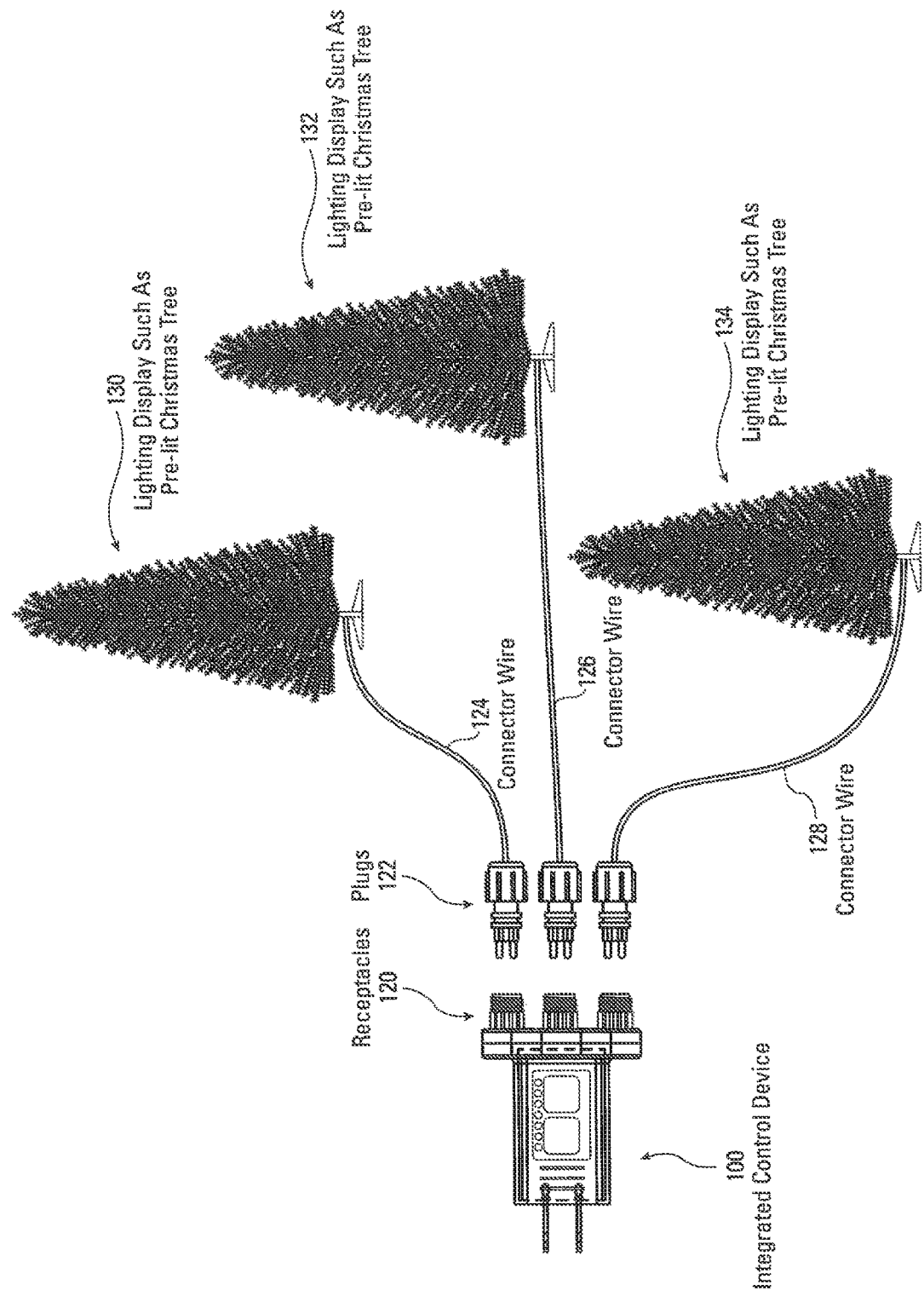
FIG. 2A is a schematic illustration of the manner in which the integrated control device can be used to control three different light displays such as pre-lit Christmas trees or commercial advertising light displays.

FIG. 2A is a schematic illustration of an embodiment for separately controlling the lights on lighting displays such as pre-lit Christmas trees or lighted decorations 130, 132, 134. The integrated control device is capable of creating various lighting effects for each of the lighting displays 130, 132, 134. For example, flashing or fading lights and the generation of different colors can be created for each of the lighting displays 130, 132, 134 by the integrated control device 100. Various techniques can be used such as variation of voltage levels, changes in direction of supply current and other techniques can be created by the integrated control device 100. Different color LEDs can be reverse connected in parallel to create different color lights by reversing the flow of current. An example of LEDs that can be individually controlled to create different visual effects are disclosed in U.S. Pat. No. 10,542,602 issued Jan. 21, 2020 to Yu. This patent is specifically incorporated herein by reference for all that it discloses and teaches. Examples of AC to DC converters are disclosed in U.S. Pat. No. 8,314,564 issued Nov. 20, 2012 to Yu et al., U.S. Pat. No. 9,226,351 issued Dec. 29, 2015 to Chen et al., U.S. Pat. No. 9,955,538 issued Apr. 24, 2018 to Yu et al., and U.S. Pat. No. 8,723,432 issued May 13, 2014 to Yu et al., all of which are specifically incorporated herein by reference for all that they disclose and teach. An example of a compact converter plug is disclosed in U.S. Pat. No. 8,836,224 issued Sep. 16, 2014 to Chen et al., which is also specifically incorporated herein by reference for all that it discloses and teaches.

The integrated control device 100, as illustrated in FIG. 2A, controls three different pre-lit Christmas trees or other lighting displays. In other words, a single integrated control device 100 can separately control pre-lit Christmas trees or lighting displays 130, 132, 134. Of course, any desired number of outputs can be generated by the integrated control device 100 to control any desired number of lighting displays. This can be very valuable in commercial applications, such as for advertising, where a number of lighting displays are used in a commercial advertising environment, which allows the lighting displays to be separately controlled. For example, colorful signs can be separately controlled that have separate messages and information for customers, as disclosed below with respect to FIG. 2B. Further, the connector wires 124, 126, 128 can be replaced with wireless connections, as disclosed below with respect to FIG. 2B, so that lighting displays and pre-lit Christmas trees can placed anywhere within the range of the wireless connection, which greatly simplifies the use of lighting displays. In that regard, the term lighting display is a generic term that includes pre-lit Christmas trees, Christmas decorations, commercial signs, commercial decorations and other lighting displays.

Figure 2B:
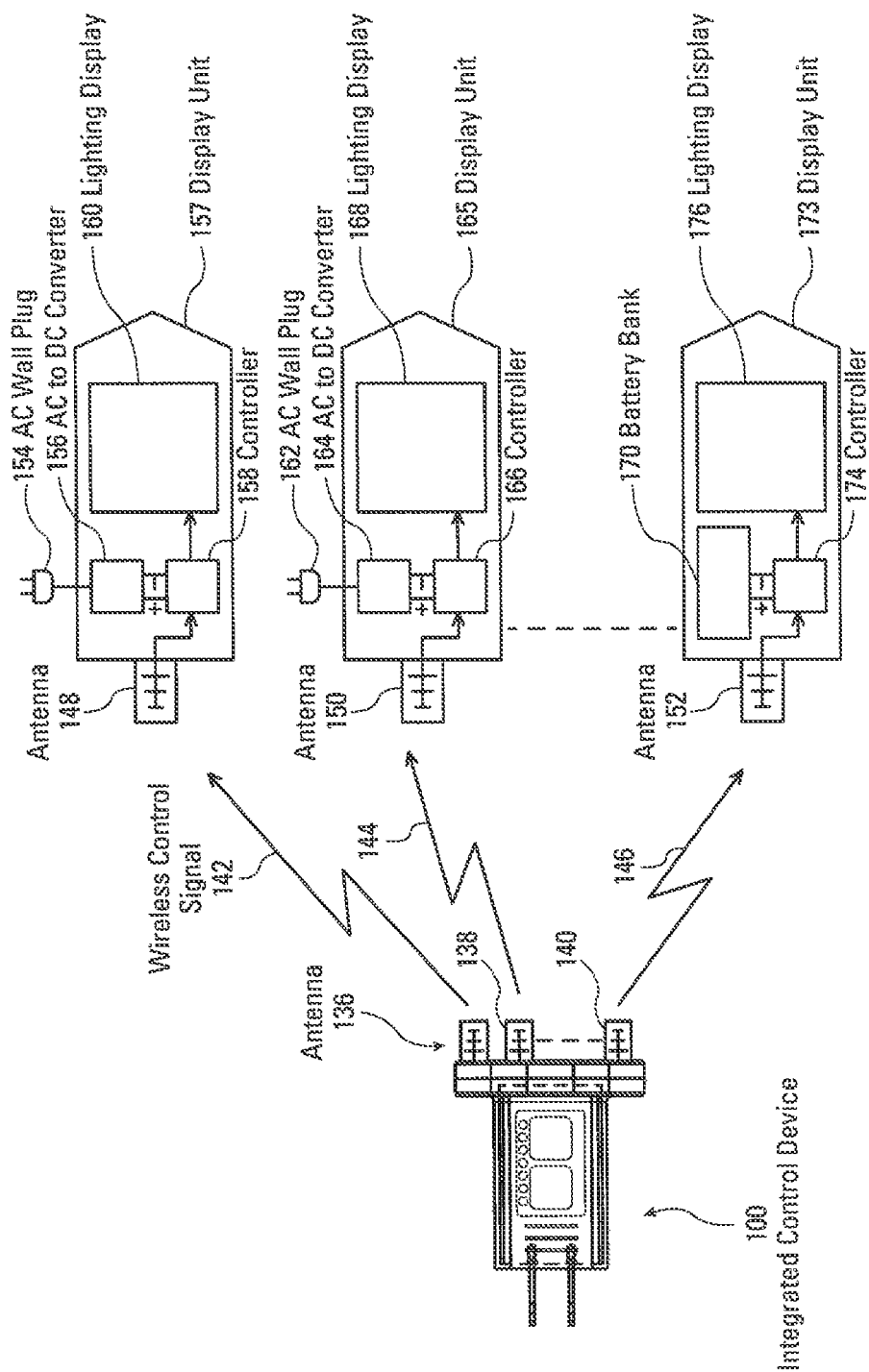
FIG. 2B is a schematic illustration of another embodiment of the present invention that uses wireless connections to control lighting displays.

FIG. 2B is a schematic illustration of another embodiment of the present invention that uses wireless connections to control lighting displays. As illustrated in FIG. 2B, the integrated control device 100 creates wireless control signals 142, 144, 146 that are transmitted by a plurality of antennas, such as antennas 136, 138, 140. Alternatively, a single antenna can be used to transmit wireless control signals 142, 144, 146. Antenna 148 of display unit 157 detects wireless control signal 142. Similarly, antenna 150 of display unit 165 detects wireless control signal 144. Wireless control signal 146 is detected by antenna 152 of display unit 173. Each of the wireless control signals 142, 144, 146 can be encoded with an address, which is detected by controllers 158, 166, 174. Alternatively, wireless control signals can be transmitted at different frequencies, or can be multiplexed or coded, so that the correct wireless signal is detected by the correct controller. Detectors, filters or other devices located at the display units 157, 165, 173 can be used to select the wireless control signal that is intended for each display unit 157, 165, 173. A remote control unit (not shown in FIG. 2B) can be used to program the integrated control device 100 by generating command signals, which are transmitted to the integrated control device 100 resulting in wireless control signals 142, 144, 146. Alternatively, manual control buttons can be placed on the integrated control device 100, such as illustrated in FIG. 1, to create command signals. As indicated above, each of the wireless control signals 142, 144, 146 can produce different controls for controlling each of the light displays 160, 168, 176 in response to the command signals. In this manner, a single integrated control device 100 can be used to separately control multiple lighting displays 160, 168, 176. The control signals are directed to controllers that can use various techniques to identify the control signal intended for that controller to control the lighting displays 160, 168, 176. AC wall plug 154 is connected to an AC to DC converter 156, which converts the AC power into a DC signal that is applied to the controller 158, which controls the illumination of the lighting display 160. Similarly, AC wall plug 162 provides AC power to AC to DC converter 164 that provides a DC signal to the controller 166. Alternatively, battery banks can be used. As illustrated in FIG. 2B, battery bank 170 provides DC power to controller 174. Controllers 158, 166, 174 control the DC power in various ways, such as disclosed above, to create different lighting effects for the lighting displays 160, 168, 176. Alternatively, the wireless control signals 142, 144, 146 may include encoded data that is used by controllers 158, 166, 174 to control the lighting displays on a pixel by pixel basis or and LED by LED basis, such as disclosed in U.S. Pat. No. 10,542,602, referenced above. The lighting displays 160, 168, 176 may be high-resolution screens, such as computer monitors, TVs, or the like, or simply a matrix of LEDs.

Figure 3A:
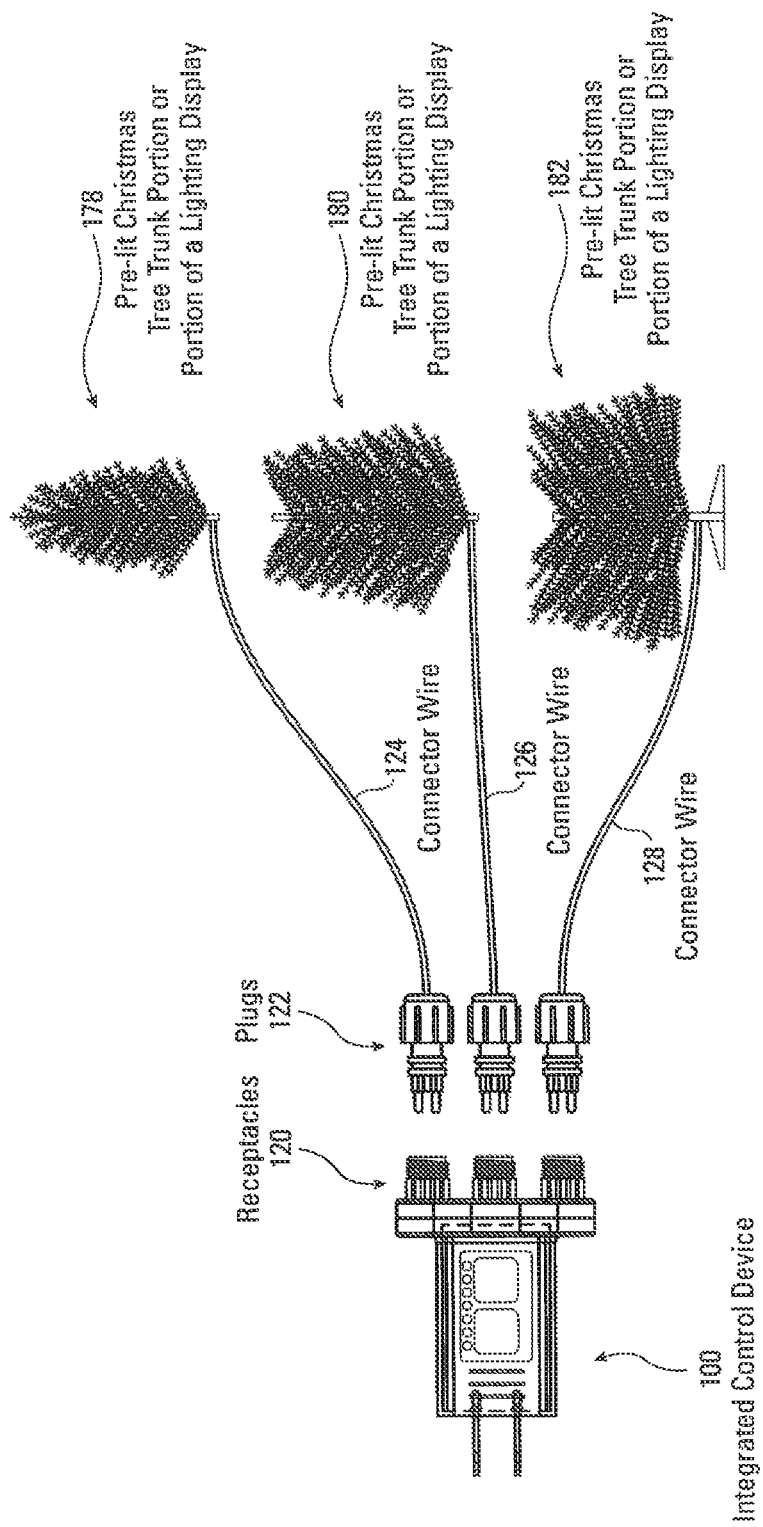
FIG. 3A is a schematic illustration of an embodiment in which the integrated control device can be used to control three different tree trunk portions of a pre-lit Christmas tree or three portions of a commercial advertising light display.
Figure 3B:
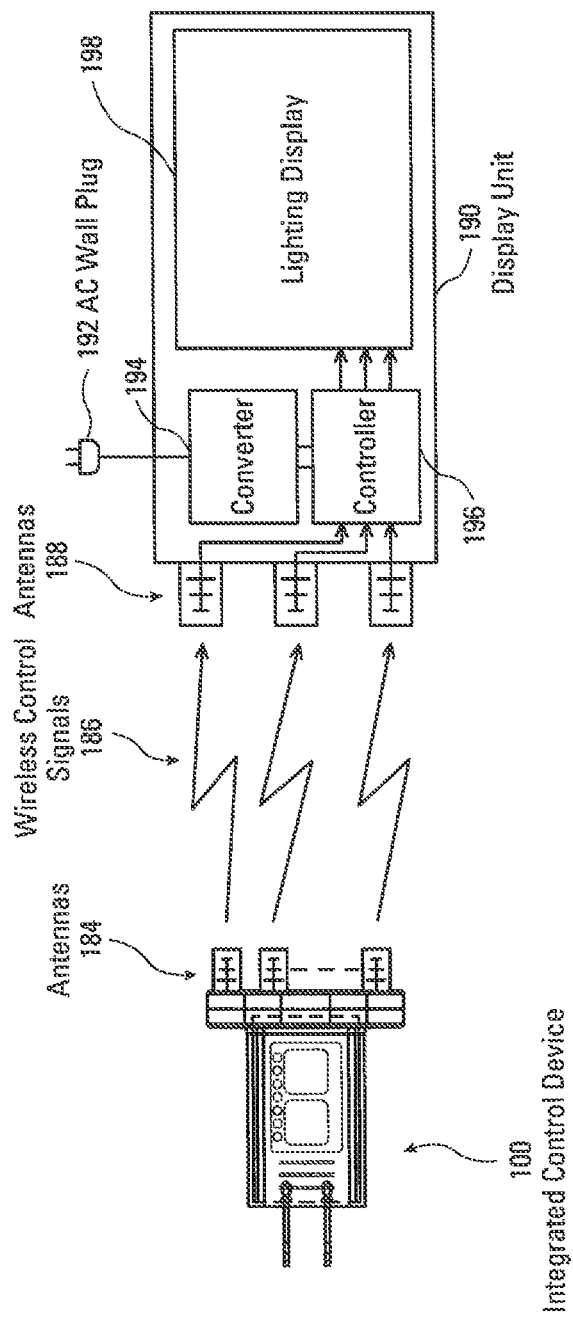
FIG. 3B is a schematic illustration of another embodiment of the invention using wireless communications and control of portions of a single lighting display.

FIG. 3A illustrates another implementation of the integrated control device 100. As shown in FIG. 3, receptacles 120 connect to plugs 122. The integrated control device 100 can be used to control the output at each of the receptacles 120, which are connected to plugs 122. Connector wires 124, 126, 128 are connected to the plugs 122 and to pre-lit Christmas tree trunk portions or portions of lighting displays 178, 180, 182. In this manner, each of the tree trunk portions of pre-lit Christmas trees can be separately controlled and portions of other types of lighting displays can also be controlled separately. For example, a commercial lighting display having color lights as background can be changed separately from the portions of a commercial sign such as a sign that can provide sales information, as set forth below with respect to FIG. 3B.

FIG. 3B is a schematic illustration of another embodiment of the invention using wireless communications and control of portions of a single lighting display 198. As illustrated in FIG. 3B, the integrated control device 100 generates control signals that are applied to antennas 184. Although three different antennas are shown, a single antenna can transmit multiple wireless control signals 186. The wireless control signals 186 are detected by antennas 188. The detected signals are applied to controller 196. AC wall plug 192 provides AC power to a converter 194 that converts the AC power into DC power. A battery bank can also be used in place of DC wall plug 192 and converter 194. Controller 196 can be used to generate multiple control signals which can control the lighting display 198 in the display unit 190. Controller 196 can control the lighting display in various ways as disclosed above, including controlling power that is applied to various parts of the lighting display, encoding signals to control individual LEDs in the lighting display 198 or applying video scripts to various parts of lighting display 198 when lighting display 198 is a video monitor. Again, encoded signals can be generated by the controller 196 that are capable of individually controlling portions of the lighting display 198. Individual pixels of the lighting display 198 can be controlled or the lighting display 198 may comprise a matrix of LEDs that can be separately controlled by multiple control signals generated by controller 196. Lighting display 198 can be a high-resolution display, such as a computer monitor, etc. In that case, controller 196 can access stored video scripts that can be displayed on different portions of lighting display 198.

Figure 4:
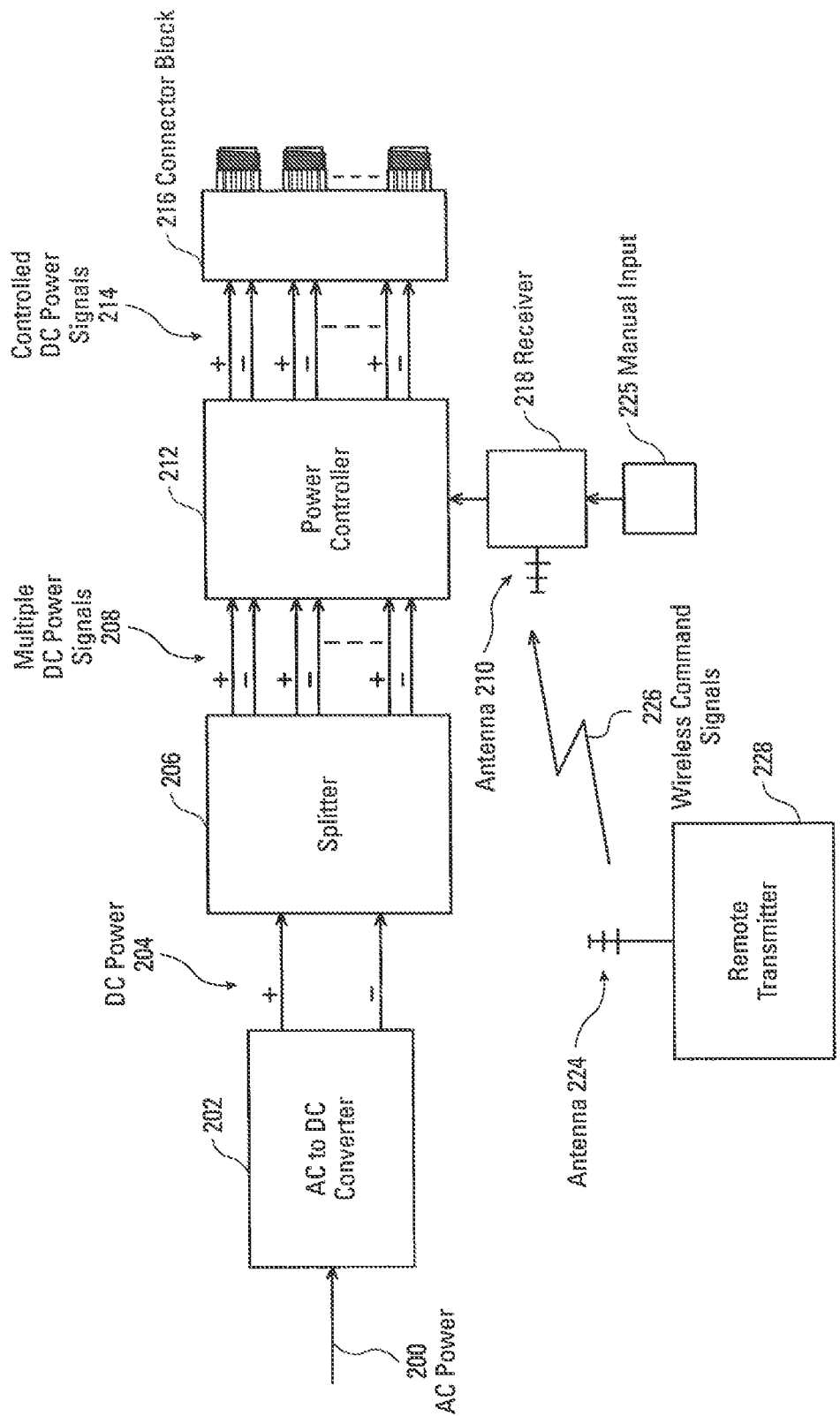
FIG. 4 is a schematic block diagram of an embodiment of the electronics of the integrated control device.

FIG. 4 is a schematic diagram of one embodiment of an implementation of the electronics of control device 100, illustrated in FIG. 1. As shown in FIG. 4, AC power 200 is applied to the AC to DC converter 202, which converts the standard AC wall power to a DC voltage suitable for illuminating LEDs. AC to DC converter 202 creates the DC power signal 204, which is applied to a splitter 206. The splitter 206 splits the DC power 204 into multiple DC power signals 208. Although three DC power signals 208 are illustrated, any number of power signals 208 can be created. The multiple DC power signals 208 are applied to the power controller 212. Receiver 218 has an antenna 210 that receives wireless command signals 226 from remote transmitter 228 via antenna 224. In operation, a user enters command signals in the remote transmitter 228, which are transmitted by antenna 224 to the antenna 210 of the receiver 218. Receiver 218 transmits the command signals to power controller 212. The wireless command signals 226 from the remote transmitter 228 separately control each of the multiple DC power signals 208 from splitter 206 to create the controlled DC power signals 214. The controlled DC power signals 214 are applied to the connector block 216, which is a transmitter that transmits said controlled DC power signals over a wired connection to pre-lit Christmas trees, trunk portions of pre-lit Christmas trees, lighting displays and portions of lighting displays. Alternatively, command signals may be entered on manual input 225 that is mounted on the integrated control device 100.

Figure 5:
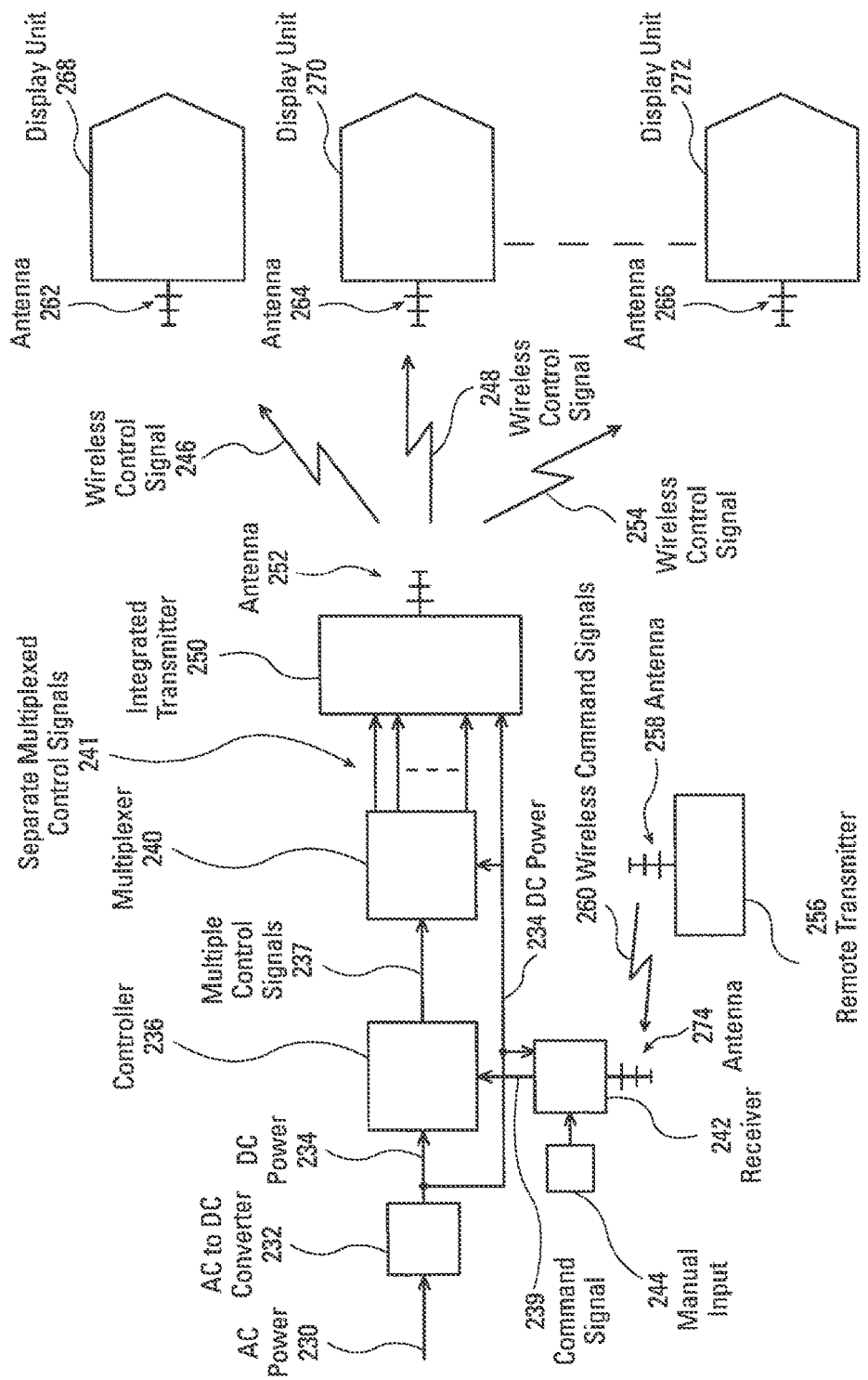
FIG. 5 is a schematic block diagram of another embodiment of the integrated control device.

FIG. 5 is a schematic block diagram of another embodiment of the electronics that can be used to wirelessly control multiple display units 268, 270, 272. As shown in FIG. 5, AC power 230 is applied to an AC to DC converter 232. The AC to DC converter 232 converts the AC signal to a DC power signal 234 that is applied to receiver 242, controller 236, multiplexer 240 and integrated transmitter 250. In that regard, any of the designs described in the above-referenced patents can be used to convert an AC power signal to a DC power signal, as well as any other desired implementations of an AC to DC converter. Alternatively, a battery bank can be used in place of AC power 230 and AC to DC converter 232.

The controller 236, illustrated in FIG. 5, generates multiple control signals, that are transmitted to multiplexer 240, that separately control display units 268, 270, 272. The controller 236 receives command signals 239 from receiver 242, which generates multiple control signals 237, that are applied to a multiplexer 240. Receiver 242 receives inputs from manual input 244 or a wireless command signals 260 from remote transmitter 256. Antenna 258 transmits wireless command signals 260, which are received by antenna 274 of receiver 242. The multiplexer 240 can be any kind of desired multiplexer. For example, time domain multiplexing or frequency multiplexing may be used to separate the multiple control signals 237 into separate multiplexed control signals 241. Other forms of multiplexing can be used to create separate multiplexed control signals 241. The separate multiplexed control signals 241 are transmitted by antenna 252 to antennas 262, 264, 266 on display units 268, 270, 272, respectively. The wireless control signals 246, 248, 254 are encoded to control separate display units 268, 270, 272. Alternatively, the wireless control signals 246, 248, 254 may be encoded to control various portions of a single lighting display 198, such as illustrated in FIG. 3B.

Accordingly, the various embodiments of the present invention provide a unique integrated system that is compact and provides the ability to separately control multiple lighting displays, such as decorations and pre-lit trees, and portions of lighting displays, such as decorations and pre-lit trees. The system can either be hardwired to the various displays or can be wirelessly connected. In addition, individual lights can be controlled using an encoded control signal, which provides a great amount of flexibility in lighting control. Also, video scripts can be used on a monitor lighting display and controlled by the integrated system.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of controlling visual effects of individual lighting displays of a series of multiple lighting displays from a single, integrated waterproof unit that can be used in outside environments comprising:

forming said single, integrated waterproof unit using plastic molding techniques to form a molded, single, integrated, waterproof package;

securing plug blades in said molded, single, integrated, waterproof package, said plug blades fitting in an alternating current wall socket;

encapsulating an AC to DC converter, that provides DC power, and a controller, that generates multiple control signals, in said molded, single, integrated, waterproof package;

sending command signals to said controller, said controller generating separate control signals for said individual lighting displays of said multiple lighting displays in response to said command signals;

sending said separate control signals from said controller to a multiplexer that is encapsulated in said waterproof package that creates separate, multiplexed control signals;

encoding said separate, multiplexed control signals for said individual lighting displays to create encoded, separate, multiplexed control signals;

sending said encoded, separate, multiplexed control signals from said multiplexer to an integrated transmitter that is encapsulated in said molded, single, integrated, waterproof package;

transmitting said encoded, separate, multiplexed control signals from said integrated transmitter to said individual lighting displays of said multiple lighting displays;

decoding said encoded, separate, multiplexed control signals to direct said separate, multiplexed control signals to said individual lighting displays of said multiple lighting displays;

using said separate, multiplexed control signals to control said individual lighting displays of said multiple lighting displays.

2. The method of claim 1 wherein said method of controlling said visual effects of said individual lighting displays of said multiple lighting displays comprises:

controlling multiple portions of a single pre-lit Christmas tree.

3. The method of claim 1 wherein said method of controlling said visual effects of said individual lighting displays of said multiple lighting displays comprises:

controlling multiple portions of a single lighted decoration.

4. The method of claim 1 wherein said method of controlling said visual effects of said individual lighting displays of said multiple lighting displays comprises:

controlling multiple portions of a lighted commercial display.

5. The method of claim 1 wherein said method of controlling said visual effects of said individual lighting displays of said multiple lighting displays comprises:

controlling portions of a lighted commercial sign.

6. The method of claim 1 wherein said method of sending said command signals to said controller comprises:

sending said command signals created in response to activation of control buttons on said single, integrated waterproof unit.

7. The method of claim 1 wherein said method of sending said command signals to said controller comprises:

sending said command signals from a remote transmitter.

8. The method of claim 1 wherein said method of encoding said separate, multiplexed control signals comprises:

encoding said separate, multiplexed control signals with different multiplexing techniques.

9. A system for controlling visual effects of multiple lighting displays comprising:

a remote transmitter that generates command signals to control said visual effects;

a plastic, molded, integrated waterproof package that receives said command signals;

plug blades secured in said plastic, molded, integrated waterproof package that fit in an alternating current wall socket;

an AC to DC converter encapsulated in said plastic, molded, integrated waterproof package that produces a direct current signal;

a receiver that receives said command signals from said remote transmitter, said receiver encapsulated in said plastic, molded, integrated waterproof package;

a controller that receives said command signals from said receiver and generates control signals to individually control said multiple lighting displays in response to said command signals, said controller encapsulated in said plastic, molded, integrated waterproof package;

a multiplexer that receives said control signals and creates multiplexed control signals;

a transmitter that transmits said multiplexed control signals to said multiple lighting displays to individually control said multiple lighting displays.

10. The system of claim 9 wherein said transmitter comprises a connector block that transmits said control signals on a wired connection.

11. The system of claim 9 wherein said transmitter transmits said control signals wirelessly.

12. The system of claim 9 wherein said multiple lighting displays are multiple pre-lit Christmas trees.

13. The system of claim 9 wherein said multiple lighting displays are multiple lighted decorations.

14. The system of claim 9 wherein said multiple lighting displays are multiple commercial lighting displays.

* * * * *